(12) United States Patent
Nuanwan et al.

(10) Patent No.: US 8,334,764 B1
(45) Date of Patent: Dec. 18, 2012

(54) METHOD AND APPARATUS TO PREVENT DOUBLE SEMICONDUCTOR UNITS IN TEST SOCKET

(75) Inventors: Suweat Nuanwan, Samutprkarn (TH); Prayoch Tayaphat, Nakornpratom (TH); Apichai Itdhiamornkulchai, Bangkok (TH)

(73) Assignee: UTAC Thai Limited, Bangna, Bangkok (TH)

( * ) Notice: Subject to any disclaimer, the term of this patent is extended or adjusted under 35 U.S.C. 154(b) by 489 days.

(21) Appl. No.: 12/567,320

(22) Filed: Sep. 25, 2009

Related U.S. Application Data

(60) Provisional application No. 61/203,103, filed on Dec. 17, 2008.

(51) Int. Cl.
G08B 29/00 (2006.01)
G01N 21/55 (2006.01)

(52) U.S. Cl. ......... 340/514; 340/517; 356/369; 356/445

(58) Field of Classification Search .................. 340/635, 340/640, 641, 647, 652, 653, 656, 514, 517, 340/518, 523; 438/7, 14; 356/237.2, 237.4, 356/237.5, 432, 464, 369, 445–448; 324/750.01, 324/750.03, 762.01; 702/64, 81, 117
See application file for complete search history.

(56) References Cited

U.S. PATENT DOCUMENTS

| | | | |
|---|---|---|---|
| 3,391,383 A | 7/1968 | Antes | 339/174 |
| 3,611,061 A | 10/1971 | Segerson | 317/234 R |
| 4,411,719 A | 10/1983 | Lindberg | 156/64 |
| 4,501,960 A | 2/1985 | Jouvet et al. | 235/492 |
| 4,713,611 A | 12/1987 | Solstad et al. | 324/158 F |
| 4,757,255 A | 7/1988 | Margozzi | 324/158 |
| 4,766,371 A | 8/1988 | Moriya | 324/158 |
| 4,779,047 A | 10/1988 | Solstad et al. | 324/158 F |
| 4,801,561 A | 1/1989 | Sankhagowit | 437/207 |
| 4,855,672 A | 8/1989 | Shreeve | 324/158 R |
| 4,871,965 A | 10/1989 | Elbert et al. | 324/158 F |
| 4,992,849 A | 2/1991 | Corbett et al. | |
| 5,006,792 A | 4/1991 | Malhi et al. | 324/158 F |
| 5,008,615 A | 4/1991 | Littlebury | 324/158 |
| 5,142,449 A | 8/1992 | Littlebury et al. | 361/400 |
| 5,247,248 A | 9/1993 | Fukunaga | 324/158 F |
| 5,248,075 A | 9/1993 | Young et al. | 228/5.1 |
| 5,396,185 A | 3/1995 | Honma et al. | 324/754 |
| 5,479,105 A | 12/1995 | Kim et al. | 324/755 |

(Continued)

OTHER PUBLICATIONS

Notice of Allowance dated Dec. 2, 2009, U.S. Appl. No. 12/080,677, filed Apr. 4, 2008, Saruch Sangaunwong.

(Continued)

Primary Examiner — Van T. Trieu
(74) Attorney, Agent, or Firm — Haverstock & Owens, LLP

(57) ABSTRACT

Before semiconductor units are shipped to customers, each unit is electrically tested for ensuring its functionality. However, when a unit is stuck in a test area of a testing equipment, subsequent units are thereafter not properly tested. A reflective sensor is used to check for a stuck unit within the test area. The reflective sensor includes a transmitter and a receiver. In each test cycle, a signal is transmitted toward the test area. An alert indicating a stuck unit is generated when: (1) the reflectivity and/or color of the transmitted signal is different from a bare test area reflectivity and/or color, (2) a reflected signal is received outside a window of the receiver or is not received by the receiver, or (3) the reflected signal has the same light intensity as the transmitted signal. Embodiments of the present invention protect untested units from being inadvertently shipped to customers.

33 Claims, 11 Drawing Sheets

U.S. PATENT DOCUMENTS

| | | | |
|---|---|---|---|
| 5,548,884 A | 8/1996 | Kim | 29/593 |
| 5,578,919 A | 11/1996 | Semba et al. | 324/158.1 |
| 5,666,064 A | 9/1997 | Kasai et al. | 324/755 |
| 5,990,692 A | 11/1999 | Jeong et al. | 324/755 |
| 6,072,239 A | 6/2000 | Yoneda et al. | 257/730 |
| 6,159,770 A | 12/2000 | Tetaka et al. | 438/112 |
| 6,225,798 B1 * | 5/2001 | Onishi et al. | 324/750.01 |
| 6,229,325 B1 | 5/2001 | Browning et al. | 324/760 |
| 6,287,878 B1 | 9/2001 | Maeng et al. | |
| 6,304,000 B1 | 10/2001 | Isshiki et al. | 257/782 |
| 6,329,711 B1 | 12/2001 | Kawahara et al. | 257/698 |
| 6,376,921 B1 | 4/2002 | Yoneda et al. | 257/787 |
| 6,392,427 B1 | 5/2002 | Yang | 324/755 |
| 6,488,416 B1 | 12/2002 | Shishikura et al. | |
| 6,552,560 B2 | 4/2003 | Melgaard et al. | 324/760 |
| 6,566,740 B2 | 5/2003 | Yasunaga et al. | |
| 6,573,121 B2 | 6/2003 | Yoneda et al. | 438/106 |
| 6,709,877 B2 | 3/2004 | Tsui et al. | 438/14 |
| 6,788,416 B2 * | 9/2004 | Reuter | 356/445 |
| 6,790,710 B2 | 9/2004 | McLellan et al. | |
| 6,800,859 B1 * | 10/2004 | Shishido et al. | 250/372 |
| 6,821,817 B1 | 11/2004 | Thamby et al. | |
| 6,872,661 B1 | 3/2005 | Kwan et al. | |
| 6,903,304 B1 | 6/2005 | McLellan et al. | |
| 6,940,154 B2 | 9/2005 | Pedron et al. | |
| 7,008,825 B1 | 3/2006 | Bancod et al. | 438/123 |
| 7,015,072 B2 | 3/2006 | Combs et al. | |
| 7,049,177 B1 | 5/2006 | Fan et al. | |
| 7,081,403 B1 | 7/2006 | Kirloskar et al. | |
| 7,101,210 B2 | 9/2006 | Lin et al. | |
| 7,102,210 B2 | 9/2006 | Ichikawa | 257/666 |
| 7,226,811 B1 | 6/2007 | McLellan et al. | |
| 7,232,755 B1 | 6/2007 | McLellan et al. | |
| 7,247,526 B1 | 7/2007 | Fan et al. | |
| 7,270,867 B1 | 9/2007 | Kwan et al. | |
| 7,271,032 B1 | 9/2007 | McLellan et al. | |
| 7,456,963 B2 * | 11/2008 | Shishido et al. | 356/369 |
| 7,791,725 B2 * | 9/2010 | Shishido et al. | 356/369 |
| 7,994,804 B2 * | 8/2011 | Miya et al. | 324/750.03 |
| 8,027,800 B2 * | 9/2011 | Nachman et al. | 702/117 |
| 2003/0207498 A1 | 11/2003 | Islam et al. | 438/120 |
| 2004/0196464 A1 * | 10/2004 | Akutsu et al. | 356/432 |
| 2005/0202575 A1 * | 9/2005 | Usui et al. | 438/7 |
| 2007/0200210 A1 | 8/2007 | Zhao et al. | 257/676 |
| 2008/0048308 A1 | 2/2008 | Lam | 257/686 |
| 2008/0150094 A1 | 6/2008 | Anderson | 257/659 |
| 2009/0223942 A1 | 9/2009 | Heyl | |

OTHER PUBLICATIONS

Non-Final Office Action dated Jun. 8, 2011, U.S. Appl. No. 12/688,602, filed Jan. 15, 2010, Saruch Sangaunwong et al.

Notice of Publication dated Mar. 22, 2012, U.S. Appl. No. 13/304,590, filed Nov. 25, 2011, Saravuth Sirinorakul.

* cited by examiner

Received light level at Light-receiving element

METHOD AND APPARATUS TO PREVENT DOUBLE SEMICONDUCTOR UNITS IN TEST SOCKET

RELATED APPLICATIONS

This application claims benefit of priority under 35 U.S.C. section 119(e) of the co-pending U.S. Provisional Patent Application Ser. No. 61/203,103 filed Dec. 17, 2008, entitled "Sensor to Prevent Double Semiconductor Units in Test Socket," which is hereby incorporated by reference in its entirety.

FIELD OF THE INVENTION

The present invention is related to the field of semiconductor device manufacturing. More specifically, the present invention relates to a method and an apparatus to prevent double semiconductor units in a test socket.

BACKGROUND

Before packaged semiconductor units are shipped to customers, each unit is electrically tested for ensuring its functionality. As illustrated in FIGS. 1A-1B, semiconductor units are placed in a test socket 115 on a platform of a semiconductor test equipment 120 to be electrically tested. The test socket 115 is typically shaped to fit the semiconductor units for testing. An active body guide 105, labeled as No. 1, controls the positioning of a current semiconductor unit 100. The body guide 105 has a pickup head 110. The semiconductor unit 100 is coupled to the bottom end of the pickup head 110 for placement within the test socket 115. When the active body guide 105 is directly over the test socket 115 of the platform, the pickup head 110 moves down to position the semiconductor unit 100 within the test socket 115 for testing. After the current semiconductor unit 100 is tested, the pickup head 110 picks up the tested semiconductor unit 100, and the next body guide 105', labeled as No. 2, moves forward, directly above the test socket 115 to test the next semiconductor unit 100'. Each body guide is similarly configured. The testing of each subsequent semiconductor unit cyclically continues as described.

Although faulty semiconductor units can be detected during testing, it is possible that a semiconductor unit can become stuck in the test socket 115 and, as such, can prevent subsequent semiconductor units from being electrically tested. For example, if the semiconductor unit 100 becomes stuck in the test socket 115, the next semiconductor unit 100' is placed on top of the stuck semiconductor unit 100 and not in the test socket 115, as illustrated in FIG. 1C, resulting in a double semiconductor unit 125. Consequently, the top semiconductor unit 100' of the double semiconductor unit 125 escapes electrical testing. Other subsequent semiconductor units also escape electrical testing. These "escaped" semiconductor units are shipped untested to customers.

The present invention addresses at least these limitations in the prior art.

SUMMARY OF THE DISCLOSURE

A first aspect of the present invention is directed to a reflective sensor. The reflective sensor includes a light transmitter to emit a light beam during one or more test cycles, a light receiver to receive the light beam, and an alerting element to notify users upon occurrence during the at least one test cycle of a predetermined state. In some embodiments, a test cycle includes loading a unit within a test area, electrically testing the unit, and removing the unit from the test area. In some embodiments, the predetermined state is the light receiver receiving a reflected light beam having the same light intensity as that of an emitted light beam. In some embodiments, the predetermined state is the light receiver receiving a reflected light beam at a location outside a window of the light receiver. In some embodiments, the predetermined state is the light receiver not receiving a reflected light beam. In some embodiments, the reflective sensor compares a sensed condition with a bare socket upon detection of a reflected light beam; the predetermined state is the sensed condition being different from the bare socket. The sensed condition is color, reflectivity or other suitable conditions. Typically, the users are notified via at least one of an alarm, a message, a stopping of a test equipment and/or other suitable alerts. In some embodiments, the reflective sensor is coupled to a test equipment.

A second aspect of the present invention is directed to a system for detecting a stuck unit. The system includes a test equipment and a reflective sensor. The test equipment includes a test area to electrically test units. The reflective sensor determines occurrence of a unit stuck within the test area. The reflective sensor typically includes a light-emitting element and a light-receiving element. The light-emitting element emits a light beam during each test cycle. In some embodiments, a cycle includes loading a unit within the test area, electrically testing the unit, and removing the unit from the test area. In some embodiments, the test area includes a layer of light-absorbing material on a surface of the test area, wherein the layer changes an intensity of the light beam. In some embodiments, the test area has a patterned surface, wherein the patterned surface reflects the light beam toward the receiving element. In some embodiments, the system further includes an alerting element to notify users upon occurrence during the test cycle of the light-receiving element receiving a reflected light beam having the same light intensity as that of an emitted light beam, the light-receiving element receiving the reflected light beam at a location outside a window of the light-receiving element, and/or the light-receiving element not receiving the reflected light beam. In some embodiments, the reflective sensor compares a sensed condition with a bare socket during the test cycle; the alerting element notifies users when the sensed condition is different from the bare socket.

A third aspect of the present invention is directed to a method of preventing a subsequent unit from being untested in a test area. The method includes transmitting a signal towards the test area during a test cycle, thereby reflecting the signal from the test area, and generating an alert after detecting presence of a unit within the test area. In some embodiments, the method further includes, before the generating step, receiving the reflected signal; typically, the reflected signal has a characteristic. In some embodiments, the presence is detected when the reflected signal is received outside a window of a receiver or is not received by the receiver. In some embodiments, the characteristic is color; the presence is therefore detected when the color of the reflected signal is different from a bare socket. In some embodiments, the characteristic is reflectivity; the presence is therefore detected when the reflectivity of the reflected signal is different from a bare socket. In some embodiments, the characteristic is intensity; the presence is therefore detected when the intensity of the reflected signal is the same as the intensity of the transmitted signal. The alert is an alarm, a message, a stopping of a test equipment, and/or other suitable alerts.

A fourth aspect of the present invention is directed to a method of using a reflective sensor. The method includes capturing a sensed condition using the reflective sensor, wherein the reflective sensor comprises an emitter and a receiver, and generating an alert when the sensed condition is different from a bare socket, wherein the reflective sensor distinguishes between conditions. The emitter typically transmits a signal during a test cycle. In some embodiments, the method further includes, prior to the capturing step, aligning the reflective sensor such that an emitted signal is directed towards a test socket, establishing baseline conditions including the bare condition, wherein the bare condition is a condition of an empty test socket, and electrically testing a unit within the test socket and attempting to remove the unit from the test socket. The bare condition is color, reflectivity, or other suitable conditions. In some embodiments, the method further includes, after the generating step, loading a subsequent unit within the test socket, and repeating the capturing step and the generating step.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for purposes of explanation. However, one of ordinary skill in the art will realize that embodiments of the invention can be practiced without the use of these specific details. Thus, the present invention is not intended to be limited to the embodiments shown but is to be accorded the widest scope consistent with the principles and features described herein or with equivalent alternatives.

Reference will now be made in detail to implementations of the present invention as illustrated in the accompanying drawings. The same reference indicators will be used throughout the drawings and the following detailed description to refer to the same or like parts.

Embodiments of the present invention are directed to a method and an apparatus to prevent double semiconductor units from occurring in a test socket of a semiconductor test equipment. In some embodiments, a reflective sensor is used to detect double semiconductor units in the test socket.

Figure 1A:
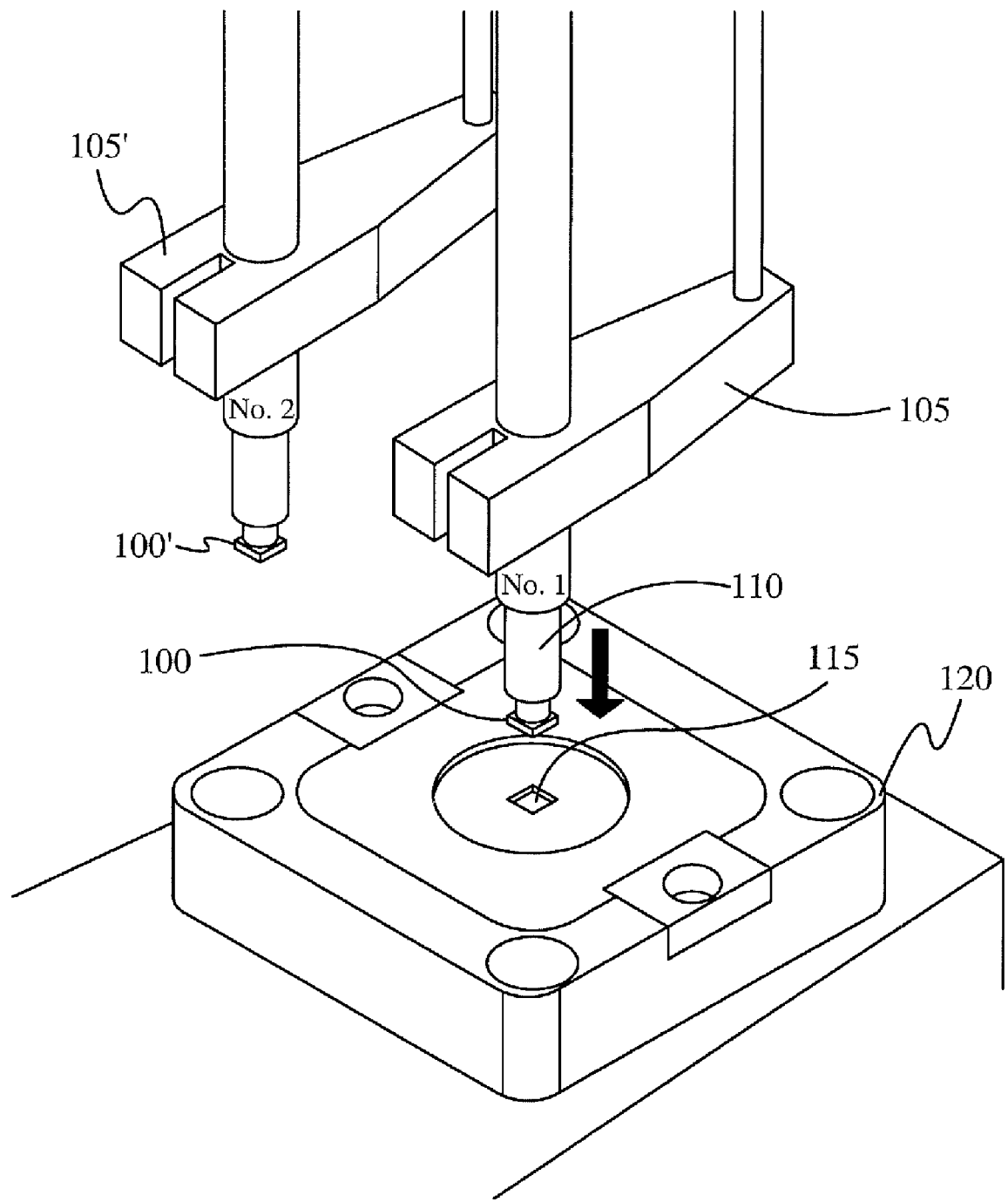
FIGS. 1A-B illustrate a semiconductor test equipment in some embodiments of the prior art.
Figure 1B:
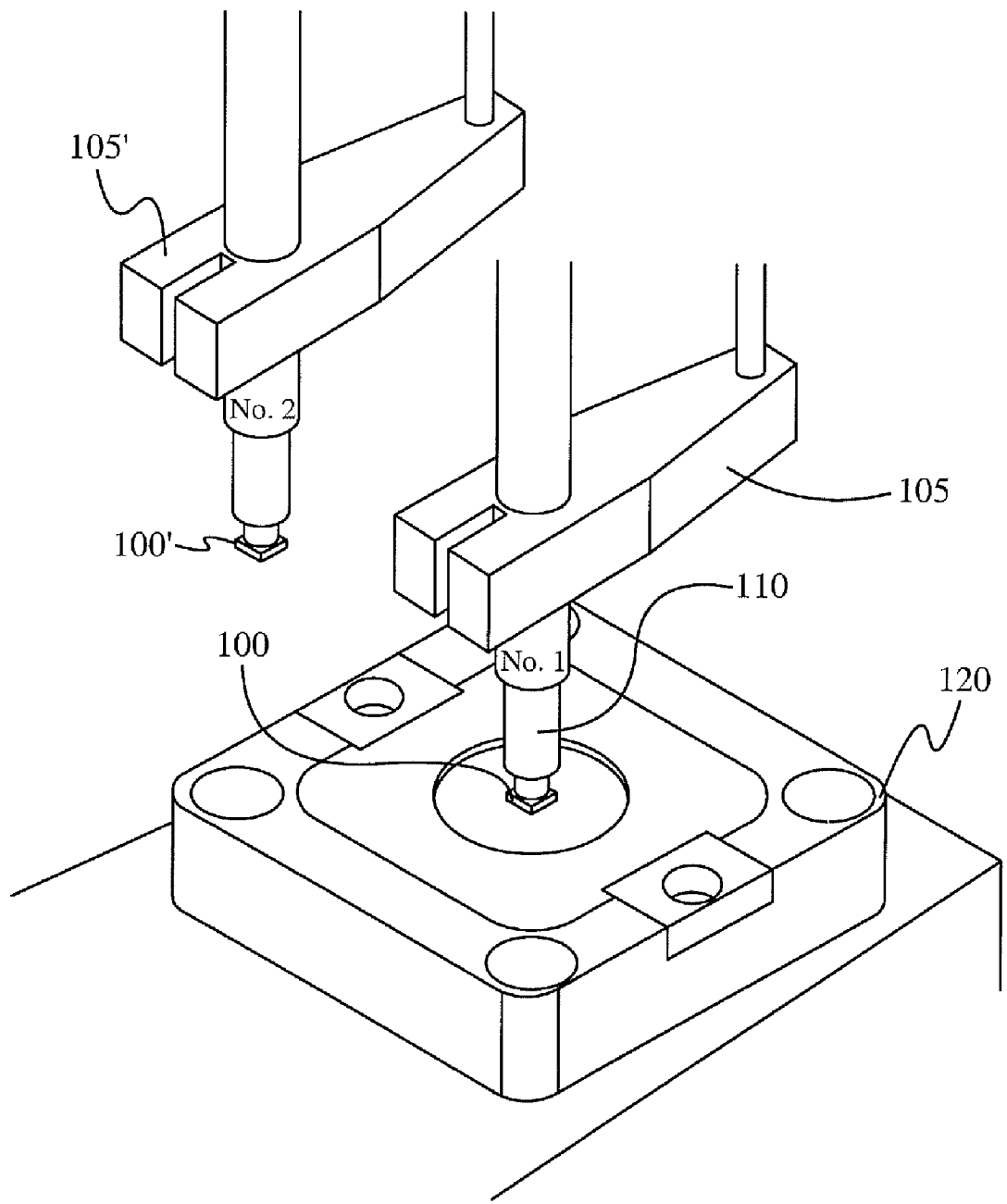
Figure 1C:
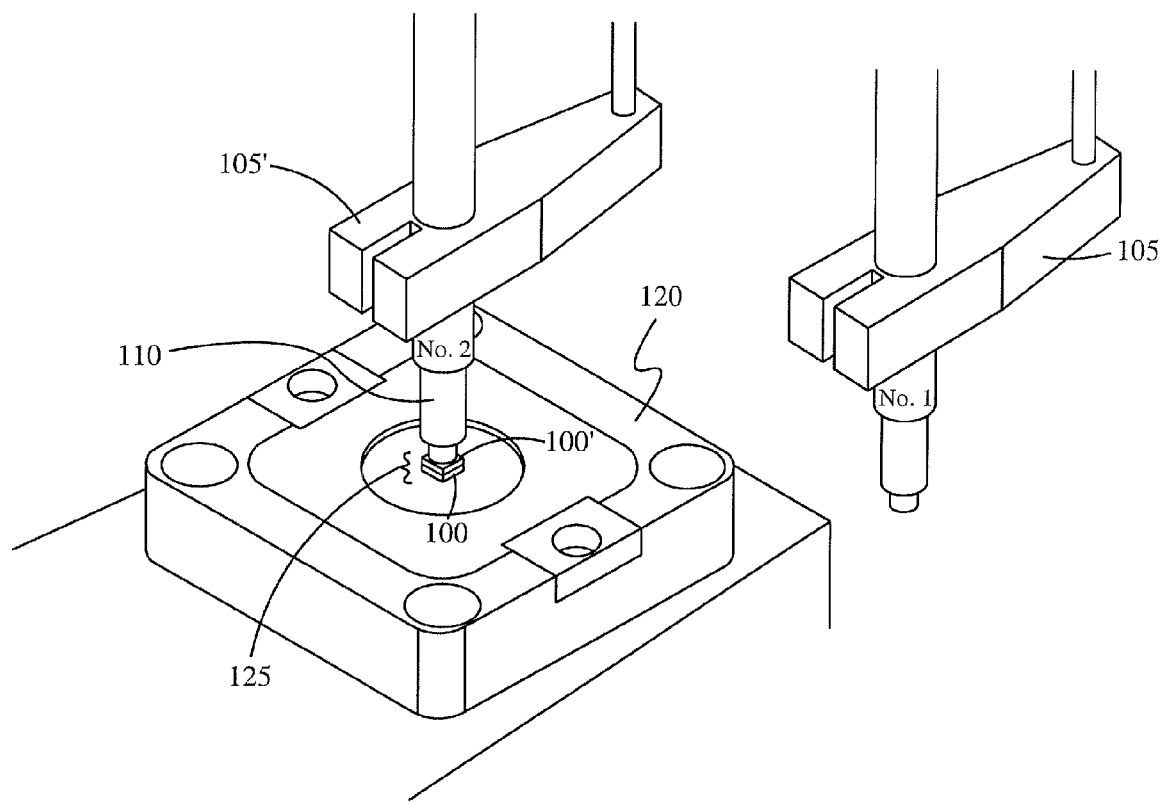
FIG. 1C illustrates a double semiconductor unit in the semiconductor test equipment according to the prior art.
Figure 2:
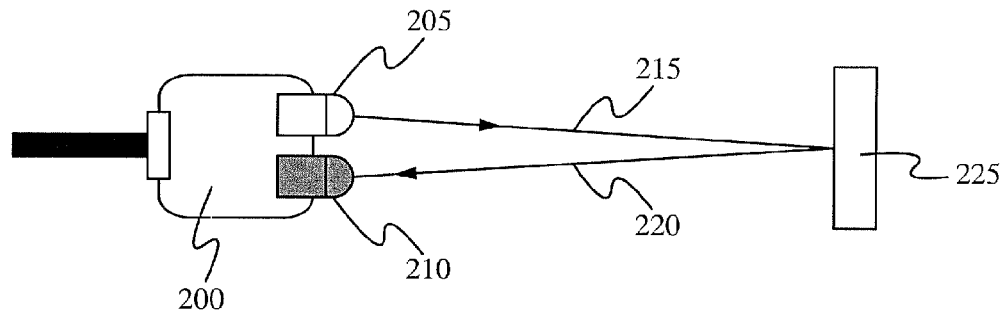
FIG. 2 illustrates a diagram of a reflective sensor in accordance with some embodiments of the present invention.

FIG. 2 illustrates a diagram of a reflective sensor 200 in accordance with some embodiments of the present invention. The reflective sensor 200 has a transmitter 205 and a receiver 210. The reflective sensor 200 is configured to emit a light beam 215 to a target 225 via the transmitter 205. The target 225 typically reflects the light beam 215. The reflective sensor 200 is also configured to receive and detect the reflected light beam 220 from the target 225 via the receiver 210. The light beam 215 can be visible or infrared. Detection occurs, in some embodiments, when the light beam is reflected by the target 225 and received by the receiver 210. The transmitter 205 and the receiver 210 are preferably angled and positioned on an optical axis relative to each other such that the receiver 210 is able to receive the light beam. The target 225 is an empty test socket of the semiconductor test equipment. Alternatively, the target 225 is a semiconductor unit in the test socket of the semiconductor test equipment.

In each cycle, the reflective sensor 200 checks for a stuck semiconductor unit in the test socket of the semiconductor test equipment. In some embodiments, the checking occurs at the beginning of each cycle before a semiconductor unit is inserted into the test socket of the semiconductor test equipment to be tested. Alternatively, the checking occurs at the end of each cycle after a semiconductor unit has been tested in the test socket of the semiconductor test equipment.

In some embodiments, the transmitter 205 is always on (e.g., light beam 215 is constantly transmitted), while the receiver 210 periodically pulses to detect the reflected light beam 220 at predetermined intervals. Alternatively, the receiver 210 is always on, while the transmitter 205 periodically pulses at predetermined intervals (e.g., light beam 215 is intermittently transmitted). Alternatively, both the light beam 215 and the receiver 210 each periodically pulses to detect the reflected light beam 220 at predetermined intervals. Typically, the predetermined interval is the total length of time for a semiconductor unit to be placed in the test socket, tested, and removed from the test socket.

Figure 3:
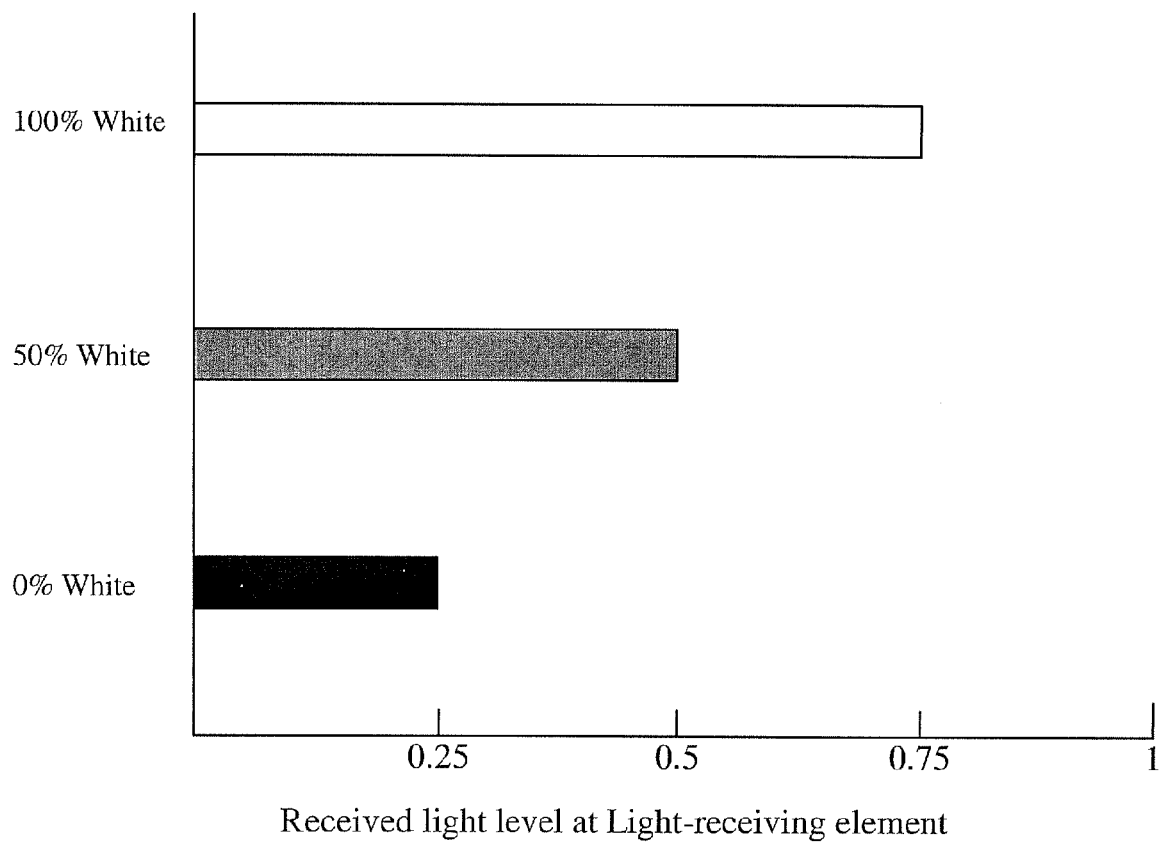
FIG. 3 illustrates a chart of exemplary light reflections received at a receiver of the reflective sensor for various target colors.

In some embodiments, the receiver 210 of the reflective sensor 200 is configured to distinguish between target reflectivities and/or colors. Each target typically has its own light reflection characteristic. In other words, when two or more targets have different reflectivities and/or colors, the reflective sensor 200 is able to distinguish between those targets, relative reflectivities and/or colors. FIG. 3 illustrates a chart 300 of exemplary light reflections received at the receiver 210 for various target colors. The chart 300 shows color on the vertical axis versus light received at the light-receiving element on the horizontal axis. As illustrated, if a target is 100% white in color, then the reflective sensor 200 detects 75% of the light level at the receiver 210. If a target is 50% white in color, then the reflective sensor 200 detects 50% of the light level at the receiver 210. If a target is 0% white in color, then the reflective sensor 200 detects 25% of the light level at the receiver 210.

Figure 4:
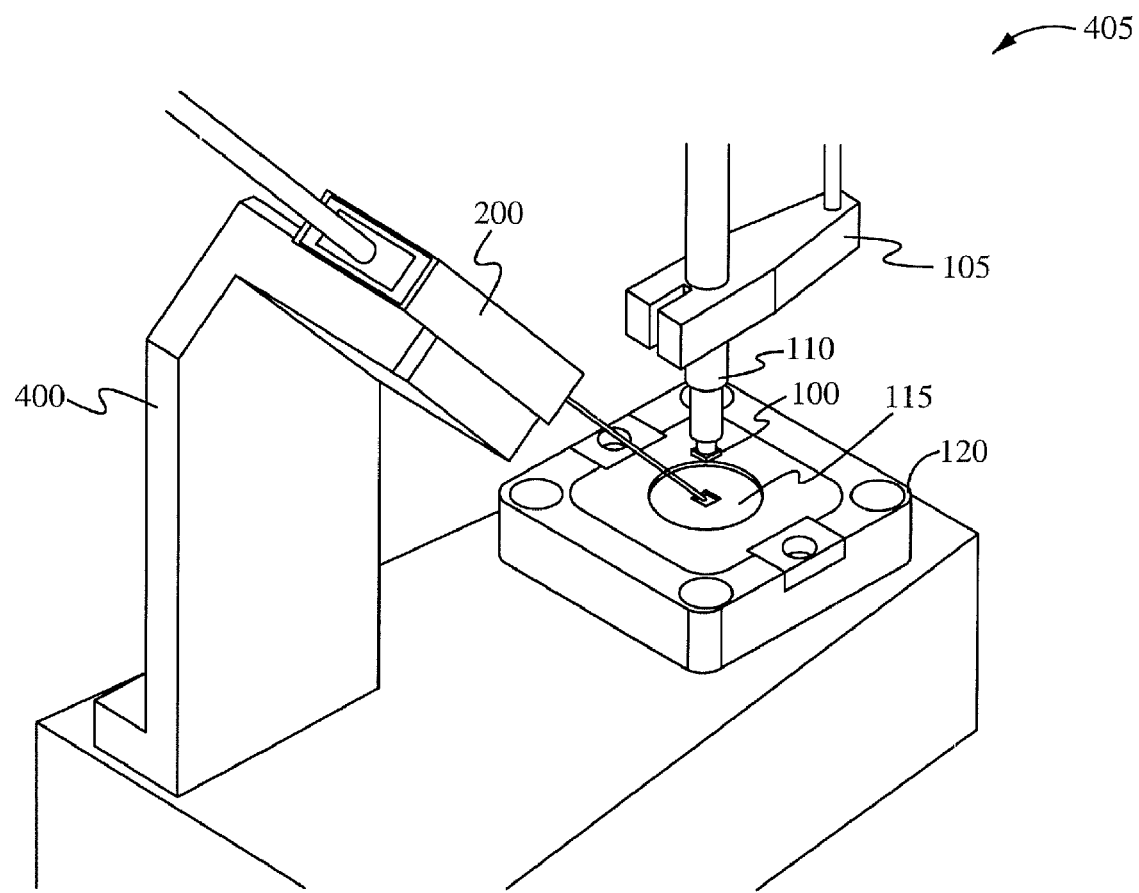
FIG. 4 illustrates the reflective sensor mounted on a stand in accordance with some embodiments of the present invention.

In some embodiments, the reflective sensor 200 is a photoelectric sensor. In other embodiments, the reflective sensor 200 has a compact size. In yet other embodiments, as illustrated in FIG. 4, the reflective sensor 200 is mounted on a stand 400 such that the target is in the line of sight of the light beam emitted from the reflective sensor 200. In some embodiments, the reflective sensor 200 is coupled to the semiconductor test equipment. In some embodiments, the reflective sensor 200 has processing capabilities (not illustrated) to analyze the received light beam 220. In other embodiments, an external processing unit coupled to the reflective sensor 200 analyzes the received light beam 220.

Figure 5:
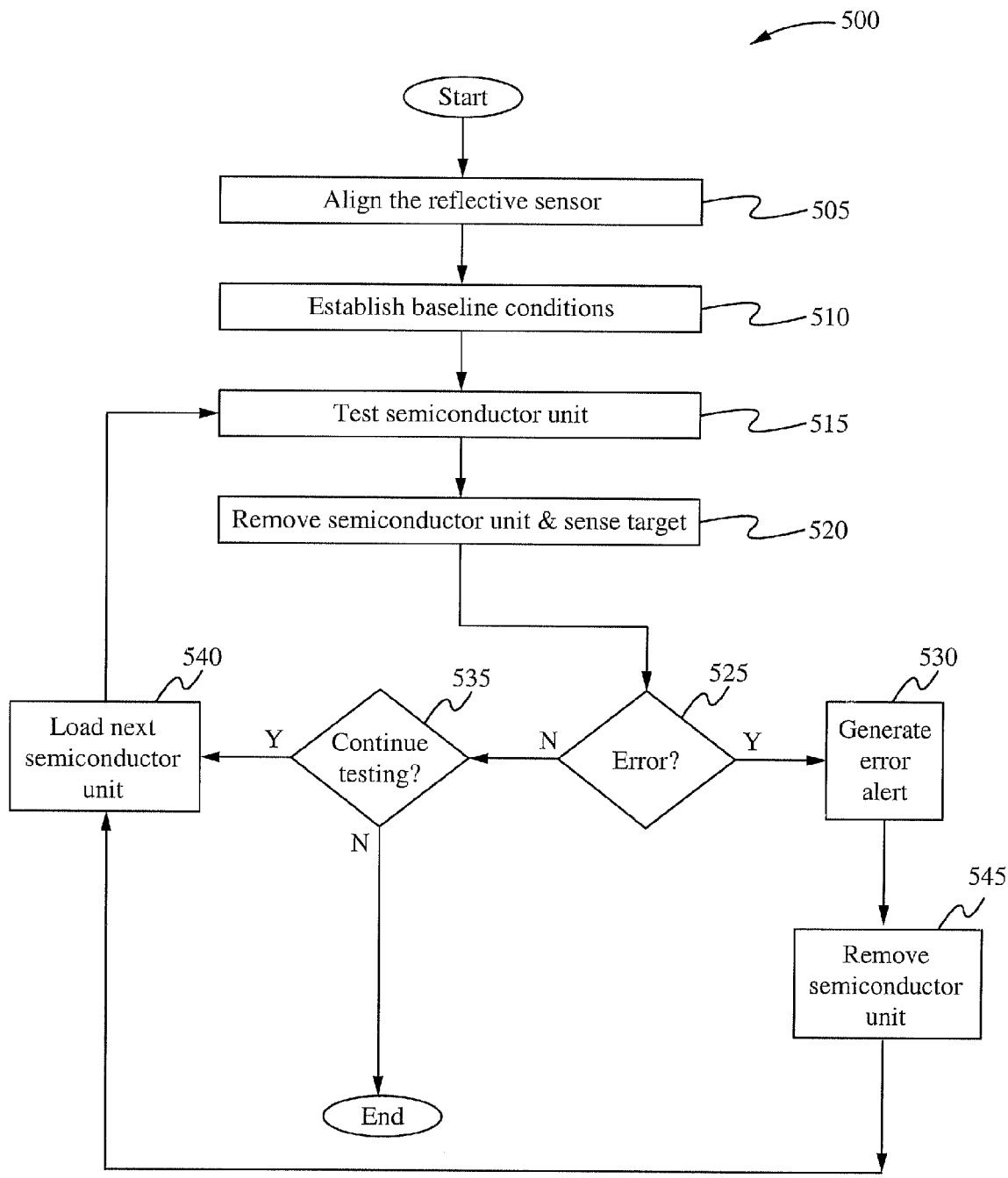
FIG. 5 illustrates an exemplary method of using the reflective sensor in accordance with some embodiments of the present invention.

FIG. 5 illustrates the steps of an exemplary method 500 of using the reflective sensor 200 (FIGS. 3 and 4) in accordance with some embodiments of the present invention. FIGS. 6A-6E graphically illustrates the steps of the method 500 performed using the testing system 405. In some embodiments, the reflective sensor 200 is used in conjunction with a semiconductor testing equipment. In some embodiments, the test handler generates an alert and stops when a tested semiconductor is stuck in order to let an operator remove the stuck unit manually.

Referring to FIGS. 5 and 6A-6E, at a Step 505, the reflective sensor 200 is positioned such that a target (e.g., test socket 115 of the semiconductor test equipment) is in the line of sight of the reflective sensor 200. For example, the reflective sensor 200 is mounted to a stand 400, as illustrated in FIGS. 6A-E. In other embodiments, the reflective sensor 200 is coupled to the semiconductor test equipment.

Figure 6A:
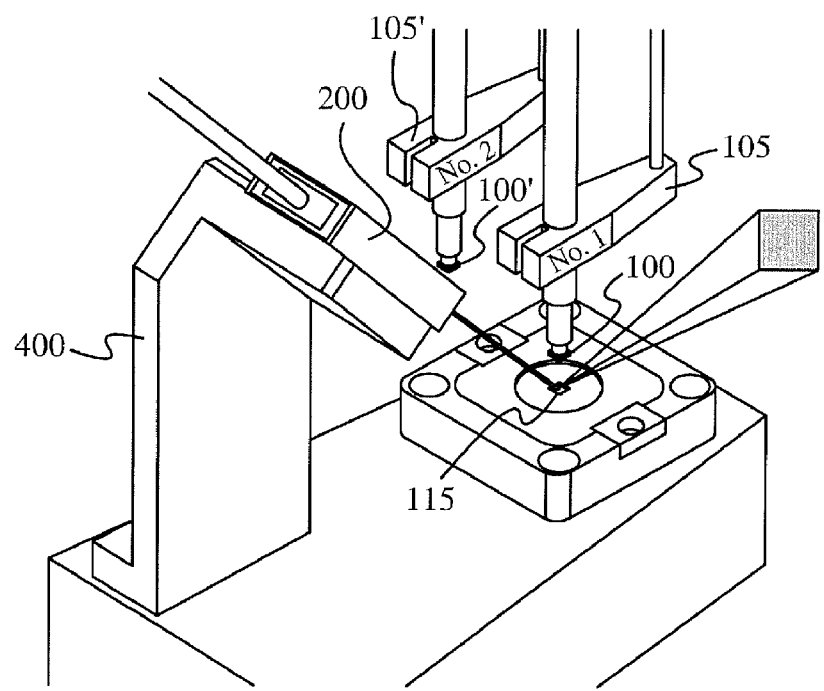
FIGS. 6A-6E illustrate a graphical process of using the reflective sensor in accordance with some embodiments of the present invention.
Figure 6B:
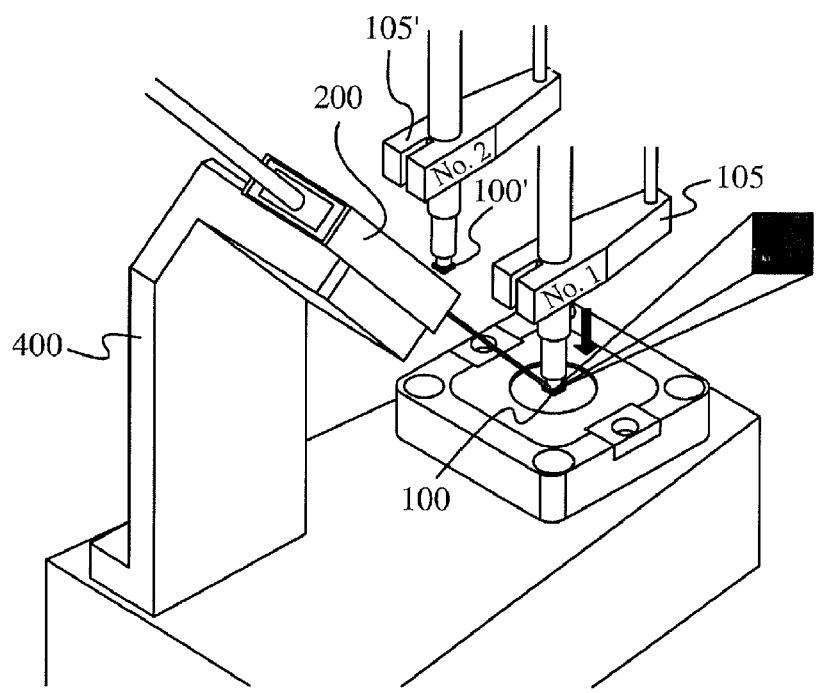

At a Step 510, baseline conditions are established. The baseline conditions include a bare socket reflectivity and/or color and a component reflectivity and/or color. The reflective sensor 200 first emits a light beam 215 to the empty test socket 115 of the semiconductor test equipment when there are no semiconductor units in the test socket 115, as illustrated in FIG. 6A. The bare socket reflectivity and/or color is captured by the reflective sensor 200. Next, a semiconductor unit 100 is placed within the test socket 115 via a pickup head of the semiconductor testing equipment. The component reflectivity and/or color of the semiconductor unit 100 is captured by the reflective sensor 200, as illustrated in FIG. 6B. The base line conditions in some embodiments are thereby established. Base line conditions can include more or less information. Typically, the bare socket reflectivity and/or color is different from the reflectivity and/or color of the semiconductor unit 100 or other component under test.

In some embodiments, the baseline conditions are established during manufacturing.

In some embodiments, the baseline conditions also include data for different semiconductor test equipments such that the reflective sensor 200 can alternatively be used with the different semiconductor test equipments.

In some embodiments, the transmitter is always on (e.g., light beam is constantly transmitted) during use of the semiconductor testing equipment, as illustrated in FIGS. 6A-E. Alternatively, the transmitter pulses intermittently or periodically during use of the semiconductor testing equipment, wherein the light beam is transmitted at predetermined intervals. The predetermined intervals can be set and/or changed by a user. Alternatively, the light beam can be selectively turned off without affecting the use of the semiconductor testing equipment.

At a Step 515, the semiconductor unit 100 within the test socket 115 is electrically tested. In some embodiments, the Step 505 is performed prior to capturing the component reflectivity and/or color. In other embodiments, the Step 515 is performed concurrently with the capturing of the component reflectivity and/or color.

At a Step 520, the pickup head attempts to pick up the tested semiconductor unit 100. In some embodiments, the semiconductor testing equipment segregates electrically problematic semiconductor units from other tested semiconductor units. The target (e.g., the test socket 115 when the semiconductor 100 is successfully removed) is then sensed using the reflective sensor 200 to capture a sensed reflectivity and/or color. The sensed reflectivity and/or color is then processed. In some embodiments, the sensed reflectivity and/or color is compared against baseline conditions.

Figure 6C:
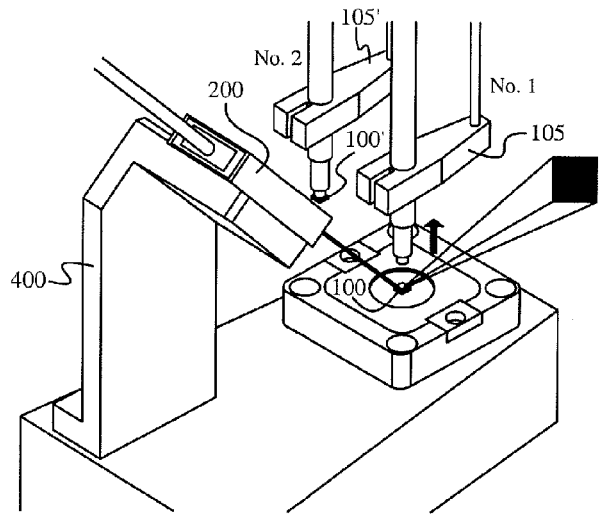

At a Step 525, it is determined whether an error (e.g., the "test escape" problem) has occurred. In some embodiments, the "test escape" problem occurs when the sensed reflectivity and/or color is different from the bare socket reflectivity and/or color, which indicates that the pickup head did not successfully pick up the tested semiconductor unit 100 after testing, as illustrated in FIG. 6C. When such error occurs, an error alert is generated in a Step 530. In some embodiments, the test handler 100 is halted before the next semiconductor unit 100' is tested. At a Step 545, the stuck semiconductor unit typically is manually removed prior to testing the next semiconductor unit. After the Step 545, the method 500 proceeds to a Step 540.

Figure 6D:
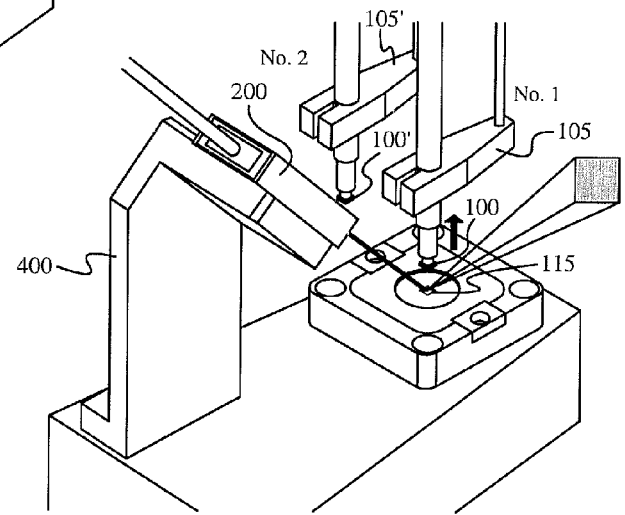
Figure 6E:
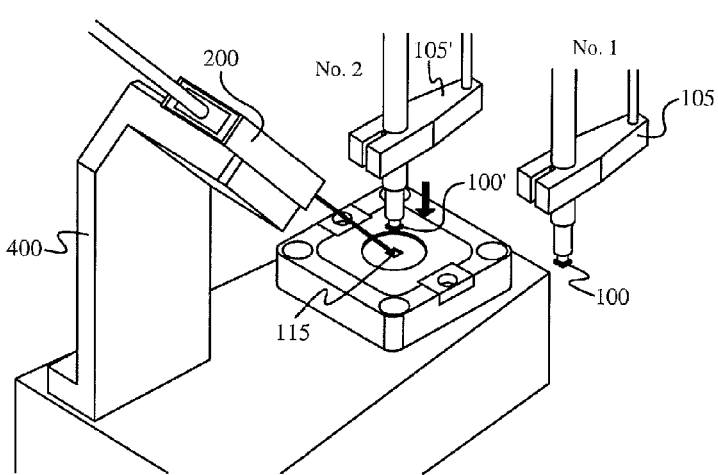

In some embodiments, no error is detected at the Step 525 if the sensed reflectivity and/or color is the same as the bare socket reflectivity and/or color, indicating that the test socket 115 is free, as illustrated in FIG. 6D. When no error is detected, at Step 525, it is determined whether there are more semiconductor units that need to be electrically tested at a Step 535. If so, then at the Step 540, the next pickup head of the test handler is moved forward and the next semiconductor unit 100' is loaded in the test socket 115, as illustrated in FIG. 6E. The process then continues at the Step 515. If not, then the method 500 ends after the Step 535.

In operation, a user typically positions/installs a reflective sensor such that the reflective sensor is in the line of sight of a test socket of a semiconductor test equipment. Each pickup head of the semiconductor test equipment is for coupling to a semiconductor unit. A body guide controls the positioning of a semiconductor unit.

Baseline conditions are first gathered if not already gathered/determined during manufacturing. During the gathering, the reflective sensor captures a bare socket reflectivity and/or color of the test socket, as described above. The first pickup head loads a semiconductor unit for the reflective sensor to then capture a component reflectivity and/or color, as described above. The baseline conditions typically include the bare socket reflectivity and/or color and the component reflectivity and/or color. More information can be included as part of the baseline conditions.

The semiconductor unit is then electrically tested in the test socket. After the semiconductor unit is tested, the pickup head picks up the tested semiconductor unit. The reflective sensor senses the test socket. The sensed reflectivity and/or color is compared with the bare socket reflectivity and/or color. If the reflectivities and/or colors are the same, then the next pickup head moves forward to test the next semiconductor unit in line. If the reflectivities and/or colors are different, then the user is alerted of the problem. Different reflectivities and/or colors indicate that a semiconductor unit is stuck in the test socket of the semiconductor testing equipment. As discussed above, the reflective sensor is able to distinguish differences between reflectivity and/or color in targets because each target has its own characteristic light reflection.

When different reflectivities and/or colors are detected, the semiconductor test equipment is halted in some embodiments. In other embodiments, the semiconductor test equipment further sounds an alarm. In other embodiments, a message alerts the user of the error. After the stuck semiconductor unit is removed from the test socket, the reflective sensor and the semiconductor test equipment are both able to resume operation. The reflective sensor of the present invention advantageously eliminates the "test escape" problem, allowing each semiconductor unit to be tested before shipping to customers.

ALTERNATIVE EMBODIMENTS

Figure 7A:
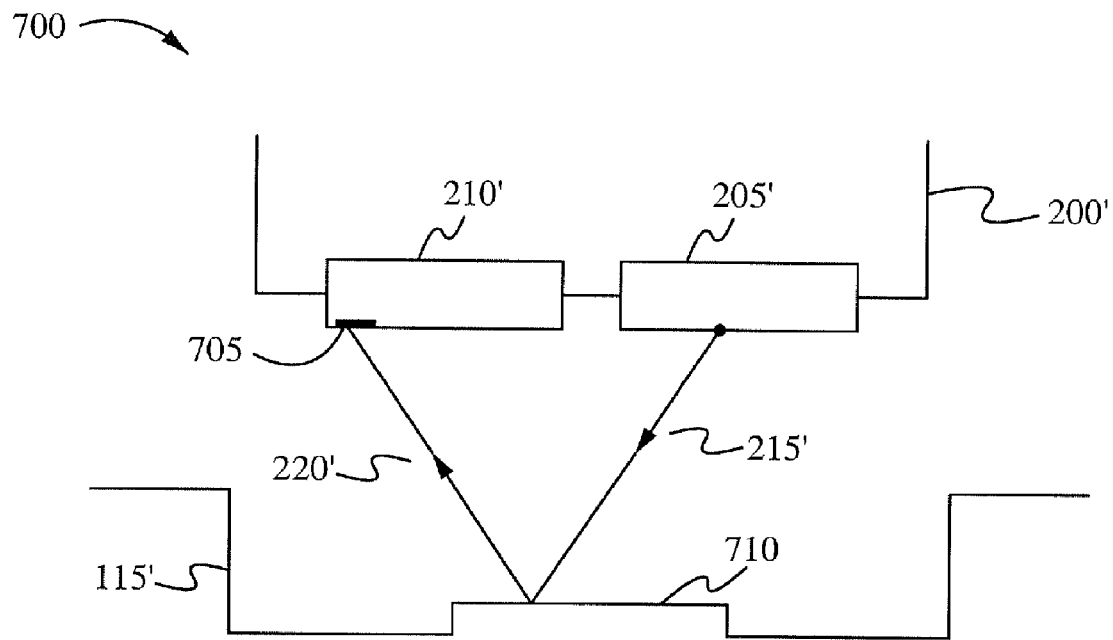
FIGS. 7A-7B illustrate a testing system in accordance with some embodiments of the present invention.
Figure 7B:
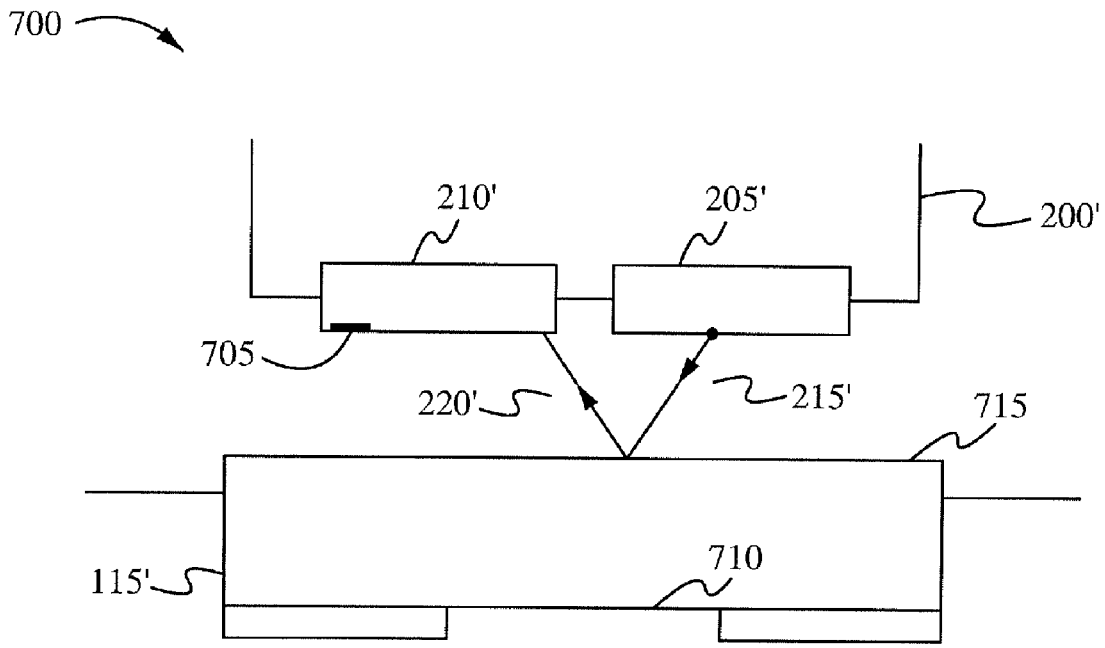

In addition or alternatively, a reflective sensor is able to detect a stuck semiconductor unit within a test socket of a semiconductor test equipment when the reflective sensor fails to receive a reflected light. FIGS. 7A-7B illustrate another testing system 700 in accordance with some embodiments of the present invention. The testing system 700 includes a semiconductor test equipment having a test socket 115' and a reflective sensor 200'. The reflective sensor 200' includes a transmitter 205' and a receiver 210'. The reflective sensor 200' is configured to emit a light beam 215' via the transmitter 205'. The reflective sensor 200' is also configured to receive a reflected light beam 220' via the receiver 210'. The surface of the test socket 115' of the semiconductor test equipment is patterned to reflect the light beam 215' emitted from the transmitter 205' to a predefined portion or window 705 of the receiver 210'. In some embodiments, the pattern is raised Step 710. The raised Step 710 is positioned in the path of the emitted light beam 215' and is configured to reflect the light beam 215' emitted from the transmitter 205' to the predefined portion 705 of the receiver 210'.

When a semiconductor unit is not within the test socket 115', the reflected light 220' is received within the predefined portion 705 of the receiver 210', as illustrated in FIG. 7A. The reflected light beam 220' received within the predefined portion 705 of the receiver 210' indicates that the test socket 115' is free and ready to test a semiconductor unit. In contrast, when a stuck semiconductor unit 715 is within the test socket 115', the reflected light beam 220' is not received within the predefined portion 705 of the receiver 210', as illustrated in FIG. 7B, or is not be received by the receiver 210' at all. In some embodiments, when the reflected light beam 220' is not received within the predefined portion 705 of the receiver 210' or is not received by the receiver 210' at all, an error alert is generated.

Figure 8A:
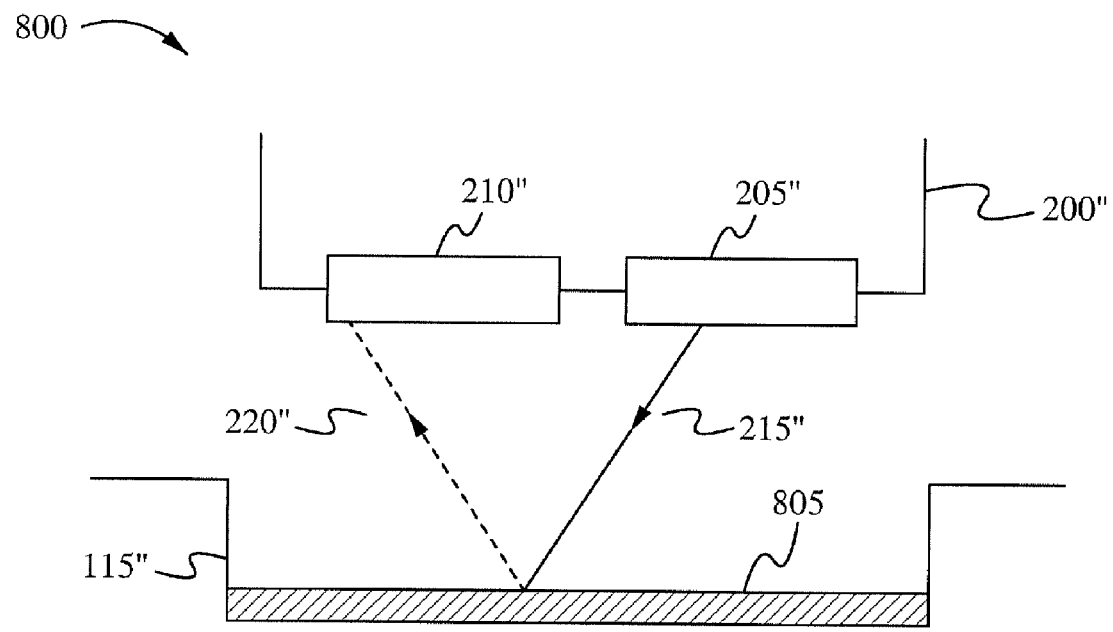
FIGS. 8A-8B illustrate another testing system in accordance with some embodiments of the present invention.
Figure 8B:
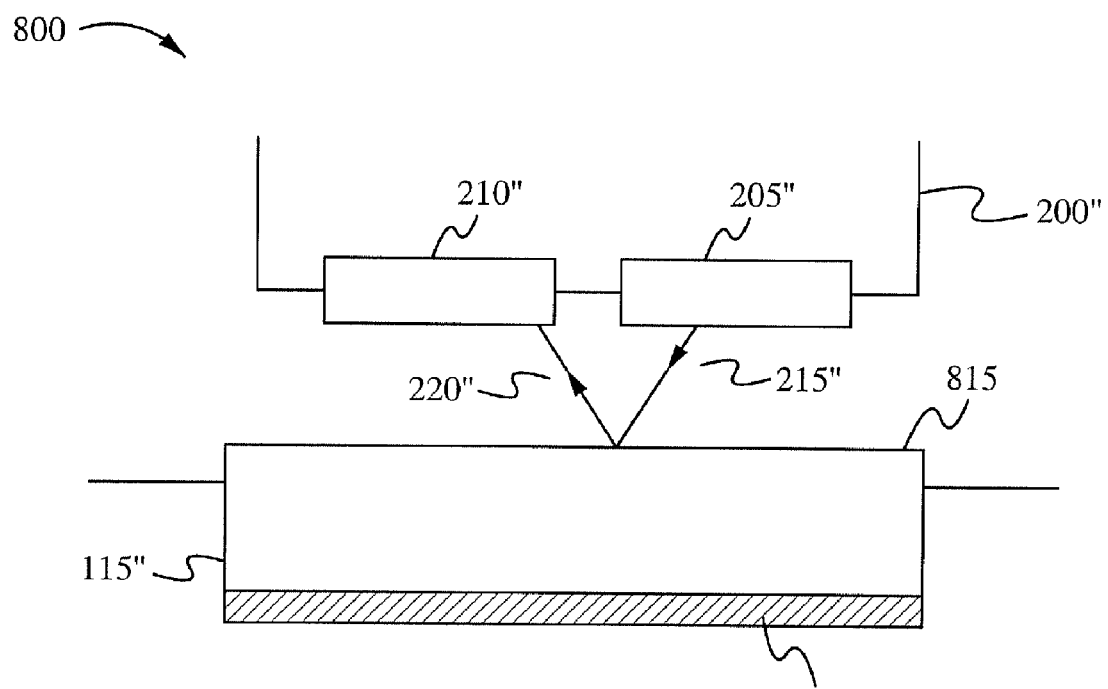

In addition or alternatively, a reflective sensor is able to detect a stuck semiconductor unit within a test socket of a semiconductor test equipment when the reflective sensor fails to receive a reflected light having the same light intensity as a transmitted light beam. FIGS. 8A-8B illustrates yet another testing system 800 in accordance with some embodiments of the present invention. The testing system 800 includes a semiconductor test equipment having a test socket 115" and a reflective sensor 200". The reflective sensor 200" has a transmitter 205" and a receiver 210". The reflective sensor 200" is configured to emit a light beam 215" via the transmitter 205". The reflective sensor 200" is also configured to receive a reflected light beam 220" via the receiver 210". A portion or all of a surface of a test socket 115" of the semiconductor test equipment has a layer of light absorbing material 805. The layer of light absorbing material 805 absorbs the light beam 215", thereby reducing the intensity of the reflected light beam 220".

When a semiconductor unit is not within the test socket 115", the reflected light beam 220" received by the receiver 210" has a different light intensity than that of emitted light beam 215", as illustrated in FIG. 8A. The light absorbing material 810 preferably changes the intensity of the emitted light beam 215". The reflected light beam 220" having a different light intensity than that of emitted light beam 215" indicates that the test socket 115" is free and ready to test a semiconductor unit. In contrast, when a stuck semiconductor unit 815 is within the test socket 115", the reflected light beam 220" has the same light intensity as that of the emitted light beam 215", as illustrated in FIG. 8B. Typically, the semiconductor unit 815 does not have light absorbing properties to alter the intensity of the emitted light beam 215". In some embodiments, when the reflected light beam 220" has the same light intensity as that of the emitted light beam 215", an error alert is generated.

In some embodiments, the light beam is monochromatic light.

Figure 9:
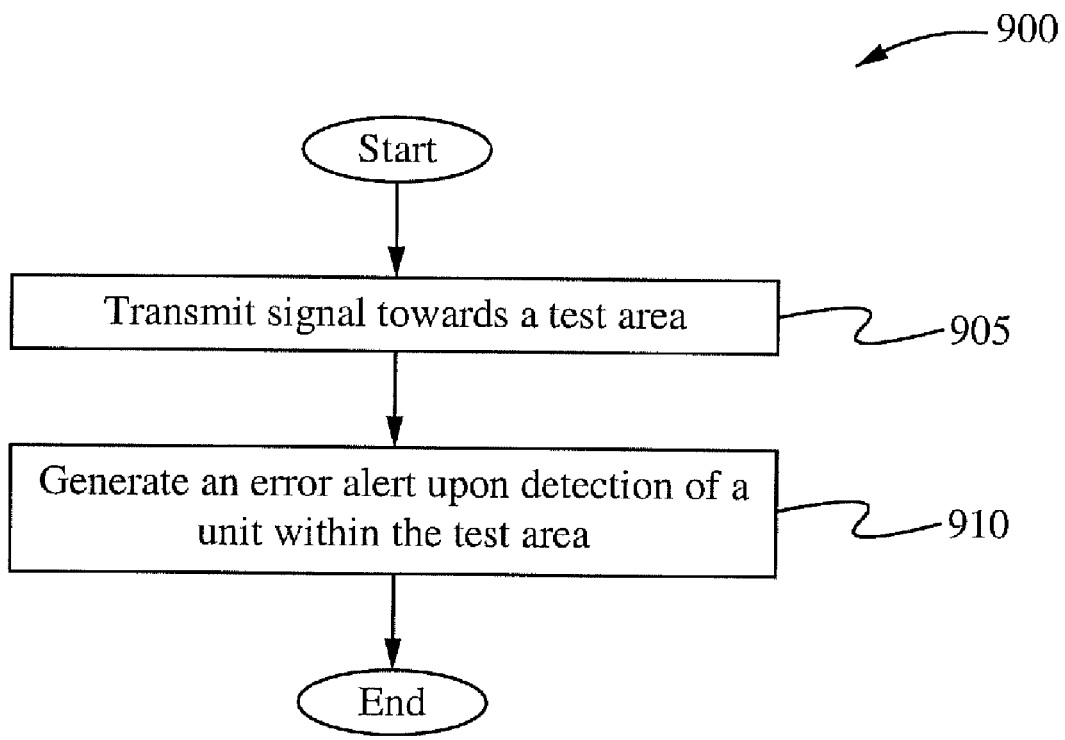
FIG. 9 illustrates an exemplary method of preventing a subsequent unit from being untested in a test area in accordance with some embodiments of the present invention.

FIG. 9 illustrates the steps of an exemplary method 900 of preventing a subsequent unit from being untested in a test area in accordance with some embodiments of the present invention. In a Step 905, a signal is transmitted towards the test area during a test cycle. The test area is a holder for securing a unit during the testing cycle. In some embodiments, the test area is a test socket of a test equipment, and the unit is a semiconductor device. Typically, the signal is reflect from the test area. In some embodiments, the signal has one or more characteristics.

In some embodiments, the surface of the test area is patterned, such that the signal is reflected from the test area to a receiver of a reflective sensor when the test area does not have a unit within it. Presence, therefore, is detected when the reflected signal is not received by the receiver or is received at a location outside a window of the receiver. In other words, presence is detected when the angle of the reflected signal is outside a predetermined angle range.

In some embodiments, the surface of the test area has a layer of light-absorbing material, such that the signal reflected from the test area has a different light intensity from the signal transmitted by the reflective sensor. Presence, therefore, is detected when the intensity of the reflected signal is the same as the intensity of the transmitted signal.

In some embodiments, the reflective sensor is able to distinguish between target reflectivities and/or colors. Preferably, reflectivity and/or color of a bare or empty test area is different from that of a test area with a unit within it. Presence, therefore, is detected when the reflectivity and/or color of the reflected signal is different from the bare reflectivity and/or color.

At a Step 910, an error alert is generated upon detection of a presence of a unit within the test area. The alert is at least one of an alarm, a message, a stopping of the test equipment, or any suitable alert to indicate a stuck unit. After the Step 910, the method 900 ends. Typically, the stuck unit is removed either manually or electronically from the test area prior to testing the next unit.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A reflective sensor comprising:
   a. a light transmitter to emit a light beam during at least one test cycle;
   b. a light receiver to receive the light beam; and
   c. an alerting element to notify users of a test escape occurrence during the at least one test cycle of a predetermined state.

2. The reflective sensor of claim 1, wherein the at least one cycle comprises loading a unit within a test area, electrically testing the unit, and removing the unit from the test area.

3. The reflective sensor of claim 1, wherein the predetermined state is the light receiver receiving a reflected light beam having the same light intensity as that of an emitted light beam.

4. The reflective sensor of claim 1, wherein the predetermined state is the light receiver receiving a reflected light beam at a location outside a window of the light receiver.

5. The reflective sensor of claim 1, wherein the predetermined state is the light receiver not receiving a reflected light beam.

6. The reflective sensor of claim 1, wherein reflective sensor detects a reflected light beam and compares a sensed condition with a bare socket.

7. The reflective sensor of claim 6, wherein the predetermined state is the sensed condition being different from the bare socket.

8. The reflective sensor of claim 7, wherein the sensed condition is color.

9. The reflective sensor of claim 7, wherein the sensed condition is reflectivity.

10. The reflective sensor of claim 1, wherein the users are notified via at least one of an alarm, a message, a stopping of a test equipment.

11. The reflective sensor of claim 1, wherein the reflective sensor is coupled to a test equipment.

12. A system for detecting a stuck unit, the system comprising:
   a. a test equipment comprising a test area to electrically test units; and
   b. a reflective sensor to determine occurrence of a unit stuck within the test area, wherein the reflective sensor comprises a light-emitting element and a light-receiving element, further wherein the light-emitting element emits a light beam during each test cycle.

13. The system of claim 12, wherein the at least one cycle comprises loading a unit within the test area, electrically testing the unit, and removing the unit from the test area.

14. The system of claim 12, wherein the test area comprises a layer of light-absorbing material on a surface of the test area, wherein the layer changes an intensity of the light beam.

15. The system of claim 12, wherein the test area has a patterned surface, wherein the patterned surface reflects the light beam toward the receiving element.

16. The system of claim 12, further comprising an alerting element to notify users upon occurrence during the test cycle of at least one of
   the light-receiving element receiving a reflected light beam having the same light intensity as that of an emitted light beam,
   the light-receiving element receiving the reflected light beam at a location outside a window of the light-receiving element, and
   the light-receiving element not receiving the reflected light beam.

17. The system of claim 12, wherein the reflective sensor compares a sensed condition with a bare socket during the test cycle.

18. The reflective sensor of claim 17, further comprising an alerting element to notify users when the sensed condition is different from the bare socket.

19. A method of preventing a subsequent unit from being untested in a test area, the method comprising:
   a. transmitting a signal towards the test area during a test cycle, thereby reflecting the signal from the test area; and
   b. generating an alert after detecting presence of a unit within the test area.

20. The method of claim 19, wherein the presence is detected when the reflected signal is received outside a window of a receiver or is not received by the receiver.

21. The method of claim 19, further comprising, before the generating, receiving the reflected signal, the reflected signal has a characteristic.

22. The method of claim 21, wherein the characteristic is color, and further wherein the presence is detected when a color of the reflected signal is different from a bare socket.

23. The method of claim 21, wherein the characteristic is reflectivity, and further wherein the presence is detected when a reflectivity of the reflected signal is different from a bare socket.

24. The method of claim 21, wherein the characteristic is intensity, and further wherein the presence is detected when a intensity of the reflected signal is the same as a intensity of the transmitted signal.

25. The method of claim 19, wherein the alert is at least one of an alarm, a message, and a stopping of a test equipment.

26. A method of using a reflective sensor, the method comprising:
   a. capturing a sensed condition using the reflective sensor, wherein the reflective sensor comprises an emitter and a receiver; and
   b. generating an alert when the sensed condition is different from a bare socket, wherein the reflective sensor distinguishes between conditions.

27. The method of claim 26, wherein the emitter transmits a signal during a test cycle.

28. The method of claim 26, further comprising, prior to the capturing, aligning the reflective sensor such that an emitted signal is directed towards a test socket.

29. The method of claim 26, further comprising, prior to the capturing, establishing baseline conditions including the bare condition, wherein the bare condition is of an empty test socket.

30. The method of claim 29, wherein the bare condition is color.

31. The method of claim 29, wherein the bare condition is reflectivity.

32. The method of claim 26, further comprising, prior to the capturing, electrically testing a unit within a test socket and attempting to remove the unit from the test socket.

33. The method of claim 26, further comprising, after the generating, loading a subsequent unit within a test socket, and repeating steps a-b.

* * * * *